(12) United States Patent
Axelberg et al.

(10) Patent No.: US 7,640,118 B2
(45) Date of Patent: Dec. 29, 2009

(54) MEASURING METHOD FOR DECIDING DIRECTION TO A FLICKERING SOURCE

(75) Inventors: Peter Axelberg, Alingsas (SE); Jonny Carlsson, Vargarda (SE)

(73) Assignee: Unipower AB, Alingsas (SE)

( * ) Notice: Subject to any disclaimer, the term of this patent is extended or adjusted under 35 U.S.C. 154(b) by 146 days.

(21) Appl. No.: 10/539,480

(22) PCT Filed: Dec. 17, 2003

(86) PCT No.: PCT/SE03/01967

§ 371 (c)(1),
(2), (4) Date: Jun. 22, 2005

(87) PCT Pub. No.: WO2004/057351

PCT Pub. Date: Jul. 8, 2004

(65) Prior Publication Data

US 2006/0071777 A1    Apr. 6, 2006

(30) Foreign Application Priority Data

Dec. 23, 2002   (SE)   .................................... 0203891

(51) Int. Cl.
*G01R 15/00* (2006.01)
(52) U.S. Cl. ........................................ 702/57; 324/512
(58) Field of Classification Search ............. 702/57–60, 702/64, 189–190; 324/508, 512, 522, 538–539; 361/78–79, 82, 84, 86–87
See application file for complete search history.

(56) References Cited

U.S. PATENT DOCUMENTS

| 4,187,461 A | 2/1980 | Cox | 324/102 |
|---|---|---|---|
| 4,251,766 A | 2/1981 | Souillard | 324/521 |
| 4,352,137 A | 9/1982 | Johns | 361/82 |
| 6,295,085 B1 * | 9/2001 | Munson et al. | 348/226.1 |
| 6,686,746 B2 * | 2/2004 | Allan et al. | 324/533 |
| 6,771,305 B2 * | 8/2004 | Smith et al. | 348/84 |

FOREIGN PATENT DOCUMENTS

EP   1 072 897   1/2001

OTHER PUBLICATIONS

Database WPI Week 199909 Derwent Publications Ltd., London, GB; Class S01, AN 1999-096615 7 CN 1195775 A (Univ Zhejiang) Oct. 14, 1998.

* cited by examiner

*Primary Examiner*—Jeffrey R West
*Assistant Examiner*—Mary C Baran
(74) *Attorney, Agent, or Firm*—Young & Thompson

(57) ABSTRACT

Method and arrangement for deciding the direction to a flickering source in relation to a measurement point in an electrical network with alternating current with a network frequency with low-frequency amplitude variations from the flickering source. The method includes the steps:
  recording an amplitude-modulated current signal having signals that originate from the network frequency and the low-frequency amplitude variations in the current signal;
  recording an amplitude-modulated voltage signal having signals that originate from the network frequency and the low-frequency amplitude variations in the voltage signal;
  creating a flicker power with a sign value by multiplication of the low-frequency amplitude variations in the current signal and the low-frequency amplitude variations in the voltage signal, and
  analyzing the sign value, with the sign value indicating in which direction the flickering source is to be found in relation to the measurement point.

15 Claims, 10 Drawing Sheets

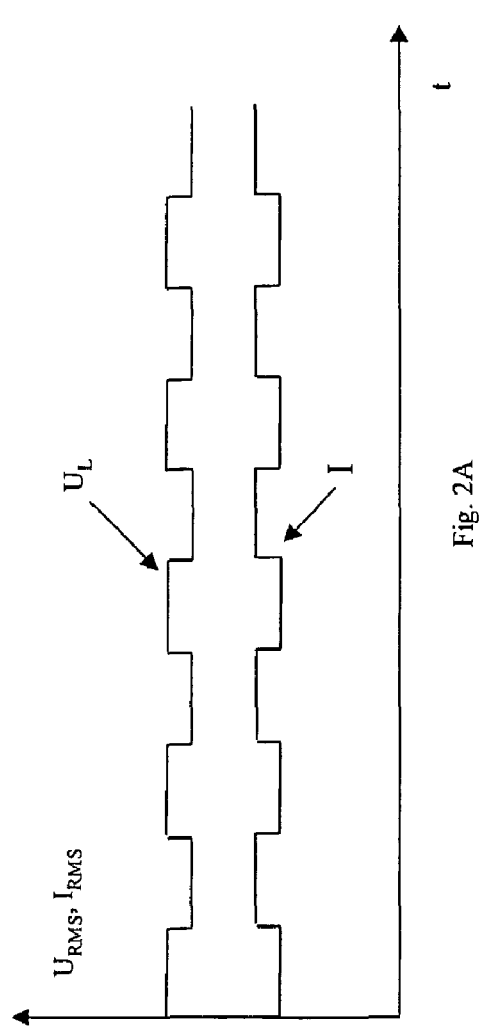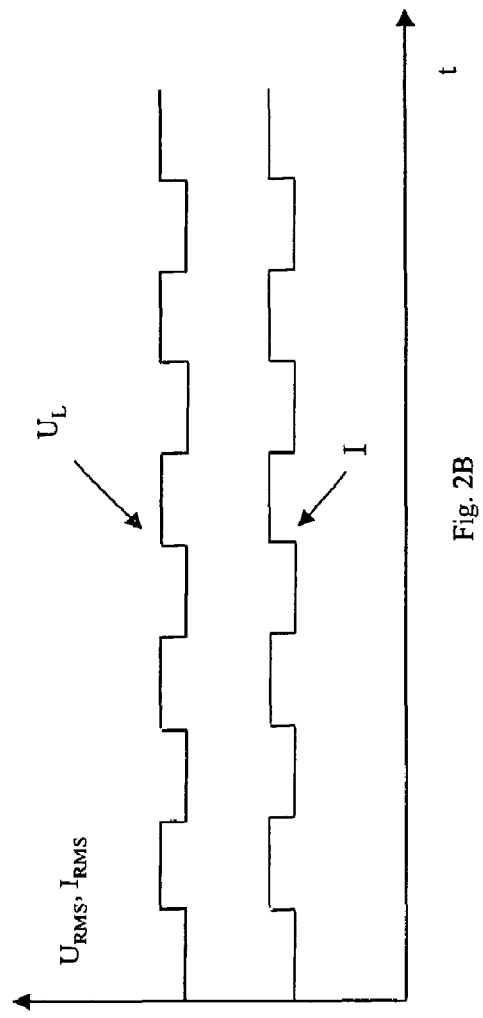

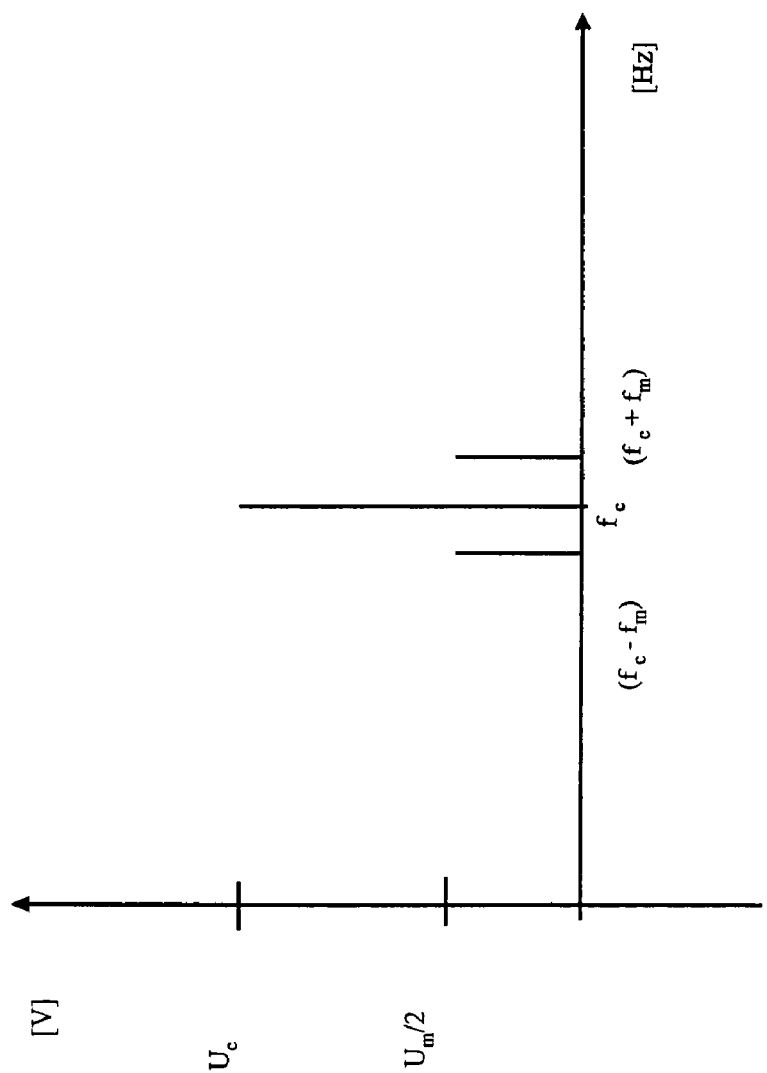

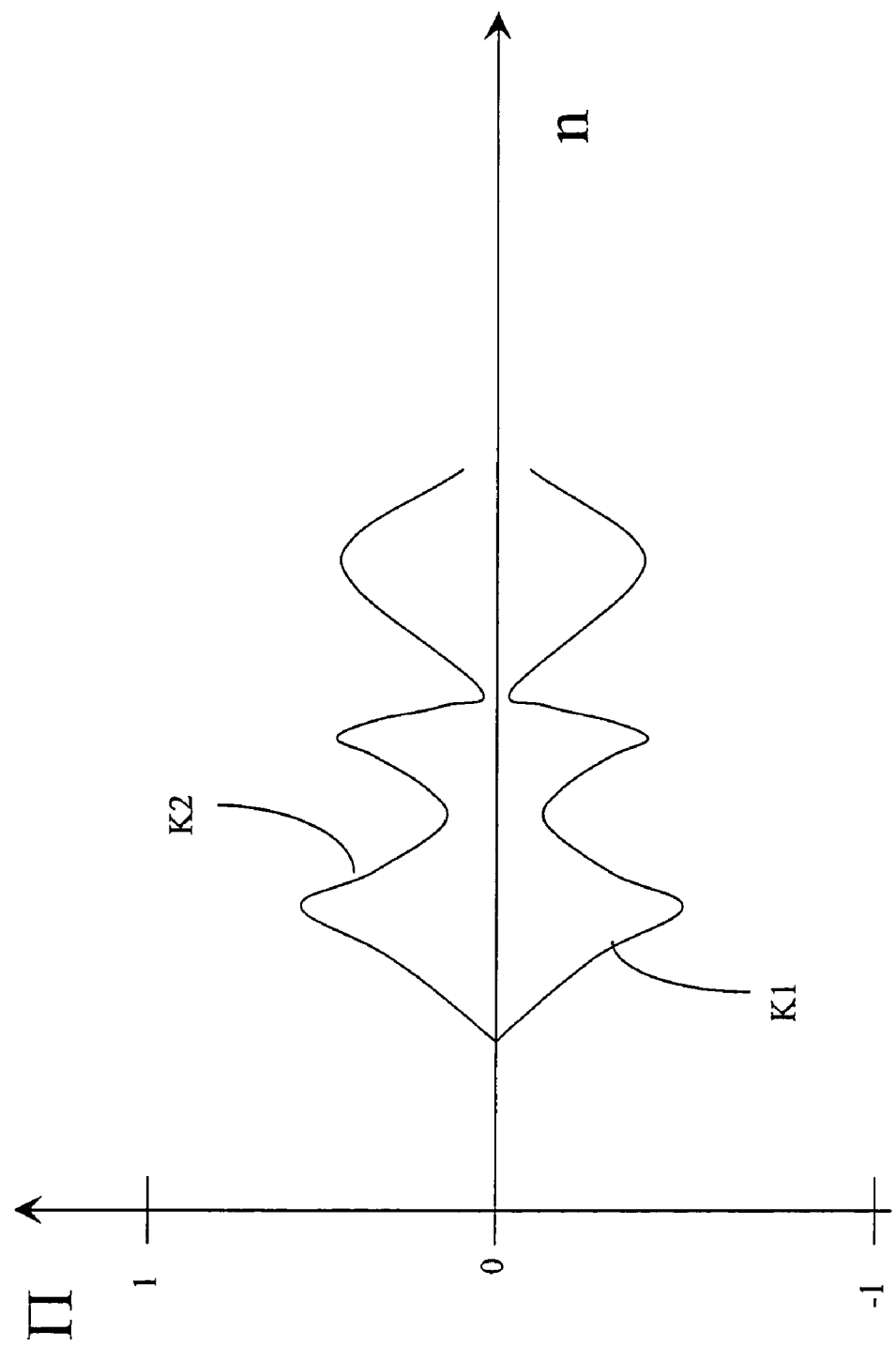

MEASURING METHOD FOR DECIDING DIRECTION TO A FLICKERING SOURCE

TECHNICAL FIELD

The present invention relates to a method for deciding the direction to a flickering source in relation to a measurement point in an electrical network with alternating current with a network frequency with low-frequency amplitude variations from a flickering source. The present invention also relates to an arrangement for carrying out the method.

BACKGROUND ART

During the production of electricity, generators are used that produce an alternating voltage around a certain frequency. The user of the produced electricity is aware of which frequency is involved and which voltage is provided on the electricity network. The user of the electricity network requires as clean electricity as possible. That is, the user requires electricity that is well-defined at the specified frequency and the specified voltage. In normal electricity networks that supply towns and factories, it is, however, normal for the electricity network to comprise low-frequency voltage distortions. Voltage distortions arise when various devices are cyclically connected into the network, which devices comprise, for example, capacitances and inductances.

Large power-hungry installations such as induction furnaces, compressors, lift motors, pumps, etc., act to increase the amount of voltage distortion in the electricity network. These loads often cause low-frequency (<25 Hz) and periodic fluctuations in the effective value of the voltage. The phenomenon is usually called flicker. The most noticeable effect of flicker is the annoyance that can be experienced when the light intensity from incandescent lamps fluctuates in line with the voltage variations caused by the flicker. Studies have shown that people are particularly sensitive to light fluctuations with a repetition frequency in the range 0.5 Hz to 25 Hz. At the level of maximum sensitivity (approx. 9 Hz), the relative voltage change needs only to be 0.25% for people to be able to perceive that the light from the incandescent lamp flickers. Problems with flicker arise primarily in areas with very heavy industry (ironworks and paper-mills, etc.) but can also arise in areas with weak electricity networks and in the vicinity of wind-power installations.

In the event of a dirty electricity network comprising flicker, it is of interest to know where the flickering source is located. An electricity producer wants to show that it is a consumer that makes the electricity network dirty and can, in such a case, demand that the consumer pay a penalty charge or corrects the problem to eliminate the flicker. A consumer, on the other hand, wants of course to show that it is not the consumer causing the problem. In addition, the consumer wants to have value for money and thus wants to show that it is the electricity producer that is supplying dirty electricity. Correcting the problem of flicker is often an expensive operation where all or parts of the network can need to be reconstructed in such a way that the internal impedance of the electricity network is reduced, for example by use of new and larger cables. Another way to correct the problem is to install counter measures against the flicker in question. Such counter measures are usually very expensive. An example of a counter measure is "Static Var Compensation (SVC)" which dynamically controls changes in the system.

Methods exist for determining the content of voltage flicker, which are described in the standard IEC-61000-4-15. Measuring instruments that record voltage flicker according to this standard show the presence of voltage flicker by calculating and displaying the parameters If1, Pst and P1t. There is, however, nothing in the standard or in existing measuring instruments that shows the direction to the flickering source in relation to the measurement point.

There is thus a great need for a method and an arrangement that can determine the direction of propagation of flicker. The direction of propagation of the flicker shows whether the flickering source is above or below a measurement point and can thus be of great use when the flickering source is to be traced.

DISCLOSURE OF INVENTION

The present invention intends to solve the problems that are described above of low-frequency flicker that gives rise to periodic fluctuations in the effective value of the voltage. In the following, such periodic fluctuations are called low-frequency variations or flicker.

The problem is solved by a method for deciding the direction to a flickering source in relation to a measurement point in an electricity network with alternating current with a network frequency $f_c$ with low-frequency amplitude variations from the flickering source. The method provides that an amplitude-modulated current signal and an amplitude-modulated voltage signal are recorded. Both the amplitude-modulated current signal and the amplitude-modulated voltage signal are signal processed in such a way that the low-frequency amplitude variations in both the current and voltage are separated from the carrier wave in the form of a flicker component for current and a flicker component for voltage. The flicker component for current is thereafter multiplied by the flicker component for voltage in such a way that a product is produced. The product is processed in such a way that a flicker power Π is obtained with a sign value that indicates in which direction a flickering source is located in relation to the measurement point.

According to an embodiment of the invention, the sign value of the flicker power at the measurement point is negative when the flickering source is located below the measurement point and positive when the flickering source is located above the measurement point.

The method has two important advantages:

1. The flicker power at the measurement point is determined. By this, the flickering source can be traced.

2. The method is also accurate when the measurement is carried out via voltage and current transformers installed in the network. The frequency spectrum of a signal with flicker consists of a carrier wave (for example 50 or 60 Hz) and of side-bands on both sides of the carrier wave, with frequency distance to the carrier wave corresponding to the flicker frequencies. The frequency spectrum of the whole signal package (carrier wave and the low-frequency signals) is thus in a narrow frequency band around the carrier wave, which means that measurement via existing current and voltage transformers can be used as these are designed for highest accuracy around the network frequency.

The invention can be carried out by a number of methods described below.

In a first method (method 1) according to an embodiment of the invention, the method includes the steps of:

recording of an amplitude-modulated current signal i(n) comprising signals that originate from the network frequency $f_c$ and the low-frequency amplitude variations in the current signal i(n);

recording of an amplitude-modulated voltage signal u(n) comprising signals that originate from the network frequency $f_c$ and the low-frequency amplitude variations in the voltage signal u(n);

signal processing of the current signal i(n) in such a way that only the low-frequency amplitude variations remain in the form of a flicker component for the current signal i(n);

signal processing of the voltage signal u(n) such a way that only the low-frequency amplitude variations remain in the form of a flicker component for the voltage signal u(n);

creation of a product by multiplication of the flicker component for current and the flicker component for voltage;

processing of the product in such a way that a flicker power Π is obtained with a sign value that indicates in which direction the flickering source is located in relation to the measurement point.

An advantage of the first method is that it does not require extensive computer capacity, but can easily be implemented in a suitable device.

According to another embodiment of method 1, the method comprises:

the signal processing of the current signal i(n) comprising the steps:

creation of a first demodulated signal by demodulation of the current signal i(n);

filtering off (eliminating) of the signals that originate from the network frequency $f_c$ in the first demodulated signal in such a way that only the low-frequency variations remain in the form of the flicker component for current;

the signal processing of the voltage signal u(n) comprising the steps:

creation of a second demodulated signal by demodulation of the voltage signal;

filtering off (eliminating) of the signals that originate from the network frequency $f_c$ in the second demodulated signal in such a way that only the low-frequency variations remain in the form of the flicker component for voltage.

According to another embodiment of method 1, the method comprises the steps:

filtering off of the signals that originate from the network frequency $f_c$ in the first demodulated signal in such a way that only the low-frequency variations relating to the flicker component for current remain in the form of a flicker signal $I_{LF(n)}$ for current;

filtering off of the signals that originate from the network frequency in the second demodulated signal in such a way that the low-frequency variations relating to the flicker component for voltage remain in the form of a flicker signal $U_{LF(n)}$ for voltage;

the product creating an instantaneous power signal Π(n) by multiplication of the flicker signal $I_{LF(n)}$ for current and the flicker signal $U_{LF(n)}$ for voltage;

the product being processed by the creation of the average value of the instantaneous power signal Π(n) whereby the flicker power Π is created with the sign value.

According to yet another embodiment of method 1, the method comprises:

the first demodulated signal being created by square demodulation of the current signal;

the second demodulated signal being created by square demodulation of the voltage signal.

According to an embodiment of method 1, the filtering is carried out with a bandpass filter with a lower limit of 0.1 Hz and an upper limit of 35 Hz. A preferred upper limit is, however, 25 Hz.

In a second method (method 2) according to an embodiment of the invention, the method includes the steps of:

recording of an amplitude-modulated current signal i(n) comprising signals that originate from the network frequency $f_c$ and the low-frequency amplitude variations in the current signal i(n);

recording of an amplitude-modulated voltage signal u(n) comprising signals that originate from the network frequency $f_c$ and the low-frequency amplitude variations in the voltage signal u(n);

frequency analysis of the wave form of the voltage signal u(n) by an N-point DFT analysis (Discrete Fourier Transform), which gives rise to a voltage vector U which contains the frequency spectrum for the voltage signal u(n) in the form of N complex voltages;

frequency analysis of the wave form of the current signal i(n) by an N-point DFT analysis (Discrete Fourier Transform), which gives rise to a current vector I which contains the frequency spectrum for the current signal i(n) in the form of N complex currents;

creation of a power vector P by the multiplication, element by element, of the voltage vector U and the current vector I;

multiplication of the power vector P by a weighting vector W that eliminates the power component that originates from the network frequency, with the power vector P comprising partial powers $P_k$ concerning power components from the flickering source, creation of a flicker power Π with a sign value by summation of the partial powers $P_k$, and analysis of the sign value, with the sign value indicating in which direction from the measurement point the flickering source is to be found.

In the second method, the voltage signal u(n) and the current signal i(n) are signal processed by the frequency analysis described above. The product given by method 1 corresponds to the creation of the power vector P in method 2. The flicker components for current and voltage in method 1 do not have anything directly corresponding to them in method 2, but flicker components arise in the form of power components $P_k$ concerning power components from the flickering source after the power vector P has been multiplied, element by element, by the weighting vector W which comprises the elements $w_k$. The processing described in method 1 corresponds to the summation of the partial powers $P_k$ in method 2.

According to an embodiment of method 2, the flicker power Π is created by the following step:

summation of the partial powers $P_k$ by the formula:

$$\Pi = \sum_{k=1}^{N} \text{Re}\left\{\frac{1}{2} W_k \cdot U_k \cdot I_k^*\right\}$$

An advantage of this method is that no demodulation residues arise.

According to another embodiment of method 2, the flicker power Π is created by the following steps square demodulation $x^2$ of the voltage signal u(n);

square demodulation $x^2$ of the current signal i(n);

calculation of the frequency spectrum of the square-demodulated voltage signal by an N-point DFT analysis (Discrete Fourier Transform) which gives rise to the voltage vector (U);

calculation of the frequency spectrum of the square-demodulated current signal by an N-point DFT analysis (Discrete Fourier Transform) which gives rise to the current vector (I);

creation of the flicker power Π by summation of the partial powers $P_k$ which contribute to the flicker phenomenon by the formula:

$$\Pi = \sum_{k=1}^{N} \text{Re}\left\{\frac{1}{2} w1_k \cdot U_k \cdot w2_k \cdot I_k^*\right\}$$

where the elements $w1_k$ and $w2_k$ replace $W_k$ and eliminate the power component that originates from the network frequency and weight the correct amplitudes of the frequency components $U_k$ and $I_k$, in accordance with:

$$w1_k = \begin{cases} \frac{1}{U_c} & \text{for } 1 \leq k \leq i \\ 0 & \text{for } k > i \end{cases}$$

$$w2_k = \begin{cases} \frac{1}{I_c} & \text{for } 1 \leq k \leq i \\ 0 & \text{for } k > i \end{cases}$$

where it is assumed that the low-frequency flickers are to be found in a frequency band up to and including tone i ($0 < f_{flicker} \leq i$).

As shown above, both method 1 and method 2 give rise to the flicker power Π according to the invention with a sign value that indicates in which direction a flickering source is located in relation to a measurement point. It is thus possible to signal process the current signal and voltage signal in both the time plane and the frequency plane in order to obtain the required flicker power Π.

The invention also relates to an arrangement comprising for carrying out the methods described above.

According to an embodiment of the invention, the arrangement comprises means for deciding the direction to a flickering source in relation to a measurement point in an electricity network with alternating current with a network frequency $f_c$ with low-frequency amplitude variations from the flickering source. The arrangement also comprises:

means for recording an amplitude-modulated current signal i(n) comprising signals that originate from the network frequency $f_c$ and the low-frequency amplitude variations in the current signal i(n);

means for recording an amplitude-modulated voltage signal u(n) comprising signals that originate from the network frequency $f_c$ and the low-frequency amplitude variations in the voltage signal u(n);

means for signal processing the current signal i(n) in such a way that only the low-frequency amplitude variations remain in the form of a flicker component for the current signal i(n);

means for signal processing the voltage signal u(n) in such a way that only the low-frequency amplitude variations remain in the form of a flicker component for the voltage signal u(n);

means for creating a product by multiplication of the flicker component for current and the flicker component for voltage;

means for processing the product in such a way that a flicker power Π is obtained with a sign value that indicates in which direction the flickering source is located in relation to the measurement point.

According to another embodiment of the invention:

the means for signal processing of the current signal i(n) comprises:

means for creating a first demodulated signal by demodulation of the current signal i(n)

means for filtering off the signals that originate from the network frequency $f_c$ in the first demodulated signal in such a way that only the low-frequency variations remain in the form of the flicker component for current;

the means for signal processing of the voltage signal u(n) comprises:

means for creating a second demodulated signal by demodulation of the voltage signal;

means for filtering off the signals that originate from the network frequency in the second demodulated signal in such a way that only the low-frequency variations remain in the form of the flicker component for voltage.

According to another embodiment of the invention, the arrangement comprises:

means for frequency analysis of the wave form of the voltage signal u(n) by an N-point DFT analysis (Discrete Fourier Transform), which gives rise to a voltage vector U which contains the frequency spectrum for the voltage signal u(n) in the form of N complex voltages;

means for frequency analysis of the wave form of the current signal i(n) by an N-point DFT analysis (Discrete Fourier Transform), which gives rise to a current vector I which contains the frequency spectrum for the current signal i(n) in the form of N complex currents;

means for the creation of a power vector P by the multiplication, element by element, of the voltage vector U and the current vector I;

means for the multiplication of the power vector P by a weighting vector W that eliminates the power component that originates from the network frequency, with the power vector P comprising partial powers $P_k$ concerning power components from the flickering source, means for the creation of a flicker power Π with a sign value, by summation of the partial powers $P_k$, and means for analysis of the sign value, with the sign value indicating in which direction from the measurement point the flickering source is to be found.

BRIEF DESCRIPTION OF DRAWINGS

The invention will be described below in the form of a number of embodiments with reference to a number of figures, in which:

FIG. 2a shows variations in the effective value $U_L$ of the voltage;

FIG. 2b shows variations in the effective value $I_L$ of the current;

FIG. 3 shows a frequency spectrum for an amplitude-modulated voltage signal with only one low-frequency component;

FIG. 10 shows schematically a diagram of the flicker power Π for a number of sampling points n.

PREFERRED EMBODIMENTS

Both the general theory and a number of embodiments will be described below. The general theory is necessary for an understanding of the embodiments described below. In the equations that are described, a point between two letters in an equation indicates a multiplication of vectors, element by element.

As mentioned above, the invention relates to a method for determining in which direction a flickering source is located in relation to a measurement point. To determine the direction of low-frequency variations such as flicker, the wave form of the voltage and current must be recorded in the phase or phases where the direction is to be determined. Thereafter, the recorded information is signal processed according to any one of the embodiments that are described in the following signal flow charts. The result of the signal processing is a flicker power Π with a sign value. The sign value indicates in which direction the flickering source is located in relation to a measurement point.

Figure 1:
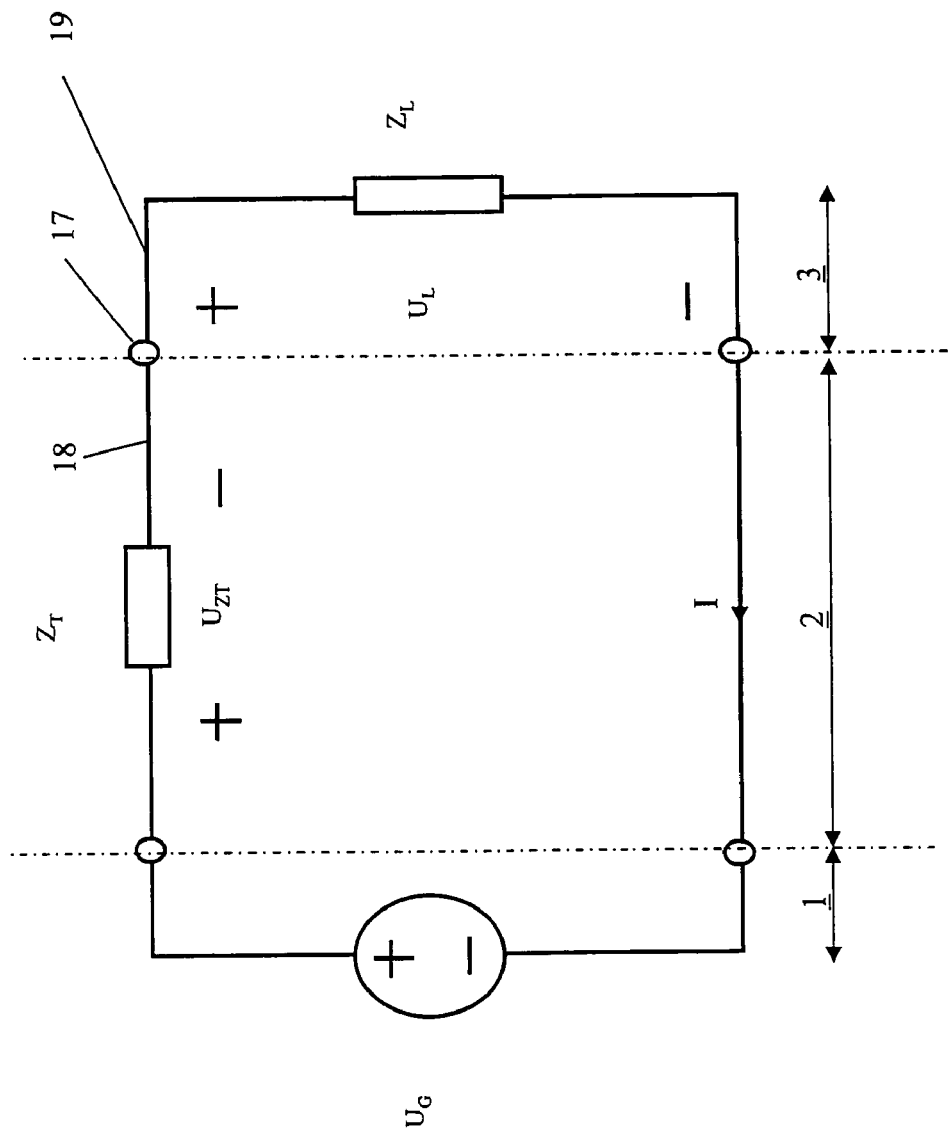
FIG. 1 shows an equivalent two-terminal network for an electricity network according to the invention.

FIG. 1 shows an equivalent two-terminal network for an electricity network according to previously known technology. The electricity network can be divided schematically into three parts which are commonly called generator 1, transmission line 2 and load 3. When a load 3 is connected, a current I will flow in the circuit. This leads to a drop in voltage $U_{ZT}$ arising across the internal impedance $Z_T$ so that the voltage $U_L$ across the load drops. If the load is connected in and disconnected periodically (cyclically), the current I will also increase and decrease cyclically, so that the voltage $U_L$ decreases and increases cyclically (provided that the generator voltage $U_G$ remains constant).

FIG. 1 shows a measurement point 17 and a point 18 that marks a point above, that is upstream of, the measurement point 17, and a point 19 that marks a point below, that is downstream of, the measurement point 17. The terms above and below the measurement point 17 are important, as it is necessary to indicate in which direction the flickering source is located in relation to the measurement point.

According to the invention, a recording is taken (at the measurement point) of an amplitude-modulated current signal i(n) comprising signals that originate from a network frequency $f_c$ and low-frequency amplitude variations in the current signal i(n). The low-frequency amplitude variations originate from the flickering source. In addition, a recording is carried out of an amplitude-modulated voltage signal u(n) comprising signals that originate from a network frequency $f_c$ and the low-frequency amplitude variations in the voltage signal u(n). Also here, the low-frequency amplitude variations originate from the flickering source.

FIGS. 2a and 2b show outline diagrams of variations in the effective value $U_{RMS}$ of the voltage for the voltage $U_L$ and effective value $I_{RMS}$ of the current for the current voltage I. According to the invention, the changes in the effective values for current and voltage $U_{RMS}$ and $I_{RMS}$ relate to the instantaneous changes in the voltage and current that arises due to the low-frequency amplitude variations from the flickering source. FIGS. 2a and 2b do not show signals that originate from the network frequency. It is, however, known that the low-frequency amplitude variations modulate the network frequency $f_c$. Any changes that take place in the current and voltage and that originate from the network frequency are negligible. The effective value changes $U_{RMS}$ and $I_{RMS}$ thus reflect the instantaneous changes in current and voltage that can be derived from the low-frequency variations. In FIGS. 2a and 2b, from the point of view of the invention, it is thus only of interest to show the variations in the effective value $U_{RMS}$ of the voltage and the effective value $I_{RMS}$ of the current. The variations in the effective value $U_{RMS}$ of the voltage and the effective value $I_{RMS}$ of the current depend, according to the method according to the invention described below, on whether the flickering source is located above or below the measurement point 17.

FIG. 2a shows the situation when the flicker power is propagated from the load towards the generator, with the changes in the effective values for current $I_{RMS}$ and voltage $U_{RMS}$ taking place instantaneously and in antiphase (180 degrees out of phase). When the load increases, the current I increases, whereby the drop in voltage across $U_{ZT}$ increases, which means that $U_L$ reduces instantaneously.

FIG. 2b shows the situation when the flicker power propagates from the generator towards the load, with the changes in the effective values for current $I_{RMS}$ and voltage $U_{RMS}$ taking place instantaneously and in phase. An increase of $U_G$ gives an instantaneous increase of the current I, which gives an instantaneous increase of $U_L$, which thus gives a simultaneous change of current and voltage.

In a theoretical consideration of flicker, it is expedient to let the current signal and voltage signal u(t), i(t) be described as an amplitude modulation. The mathematical expression for such signals is given by [1] and [2], in accordance with:

$$u(t) = \left(U_c + \sum_{k=1}^{\infty} U_{mk}\cos(\omega_k t + \beta_k)\right)\cos(\omega_c t + \beta_c) \quad [1]$$

$$i(t) = \left(I_c + \sum_{k=1}^{\infty} I_{mk}\cos(\omega_k t + \alpha_k)\right)\cos(\omega_c t + \alpha_c) \quad [2]$$

The signals consist partly of a carrier wave $U_c \cos(\omega_c t)$ and $I_c \cos(\omega_c t)$ respectively, and the low-frequency flicker signals $U_{mk}\cos(\omega_k t)$ and $I_{mk}\cos(\omega_k t)$ respectively. The index c relates to the carrier wave's component and the index m relates to the low-frequency variation's component. The index k relates to the index for a summation across values k=1 to N.

FIG. 3 shows a frequency spectrum for an amplitude-modulated voltage signal with only one low-frequency component (single-tone modulation). The low-frequency component relates here to a low-frequency tone that gives rise to the variations in amplitude of both current and voltage. By low-frequency tone is meant here a low-frequency signal.

FIG. 3 shows the frequency bands to which the low-frequency variation gives rise. In FIG. 3, $f_c$ relates to the carrier frequency and $f_m$ to the frequency of the low-frequency variation. The frequency components with single-tone modulation are to be found at the frequencies $f_c$, $f_c-f_m$ and $f_c+f_m$.

FIG. 3 also shows the amplitude $U_c$ for the voltage of the carrier frequency $f_c$ and the amplitude $U_m/2$ for the voltage component from the low-frequency variation $f_c$.

FIG. 3 shows that a frequency spectrum of the modulating tone forms an upper side-band $f_c+f_m$ and a lower side-band $f_c-f_m$ with half the original amplitude $U_m$ in each side-band and located at a frequency distance from the carrier frequency $f_c$ corresponding to the modulating frequency $f_m$. Low frequencies such as the low-frequency flicker give rise to sidebands close to the carrier frequency. The higher the frequency of the flicker, the larger the frequency distance of the modulating frequency from the carrier frequency.

The flicker power, $\Pi$, is the power that has its origin in the modulating tones and can be expressed as:

$$\Pi = \frac{1}{T}\int_0^T \left(\sum_{k=1}^{\infty} U_{mk}\cos(\omega_k t + \beta_k)\right)\left(\sum_{k=1}^{\infty} I_{mk}\cos(\omega_k t + \alpha_k)\right)dt = \quad [3]$$

$$\{\text{orthogonally}\} = \sum_{k=1}^{\infty} \frac{U_{mk}I_{mk}}{2}\cos(\beta_k - \alpha_k) = \sum_{k=1}^{\infty} \frac{U_{mk}I_{mk}}{2}\cos(\varphi_k)$$

The formula [3] shows that, after multiplication and integration, the individual low-frequency tones in current and voltage create the flicker power. In order to determine this power, the amplitude and phase of the low-frequency signals in voltage and current must be known and the low-frequency signals must be able to be extracted from the signal package [1] and [2]. This can be carried out in several different ways that lead to the same result. Examples of different methods are described below as different embodiments of the invention.

Two embodiments will be described below that are based on the frequency spectrum of the sampled wave forms u[n] and i[n] being determined by carrying out an N-point DFT analysis (DFT=Discrete Fourier Transform). In the practical case, an FFT analysis (FFT=Fast Fourier Transform) can be used, which is a calculation algorithm that provides the same information as the Fourier Transform. The output data from the analysis is two complex-value voltage and current vectors U and I, which contain frequency spectrums for u[n] and i[n] in the form of k=N complex voltages $U_k$ and currents $I_k$. The frequency resolution that is obtained depends upon the selected sampling frequency ($f_s$) and the number of samples N that are included in the calculation, in accordance with the relationship $\Delta f=f_s/N$.

Mathematically, the vectors U and I are expressed:

$$U=[U_1,U_2,U_3,\ldots U_N]=[|U_1|\angle\beta_1,|U_2|\angle\beta_2,|U_3|\angle\beta_3,\ldots,|U_N|\angle\beta_N] \quad [4]$$

$$I=[I_1,I_2,I_3,\ldots,I_N]=[|I_1|\angle\alpha_1,|I_2|\angle\alpha_2,|I_3|\angle\alpha_3,\ldots,|I_N|\angle\alpha_N] \quad [5]$$

The complex power, S, is created on the basis of the vectors U and I and contains the power quantities P (average power) and Q (reactive power) per tone in accordance with:

$$S = [S_1, S_2, S_3, \ldots S_N] = \quad [6]$$

$$\left[\frac{1}{2}U_1 \cdot I_1^*, \frac{1}{2}U_2 \cdot I_2^*, \frac{1}{2}U_3 \cdot I_3^*, \ldots, \frac{1}{2}U_N \cdot I_N^*\right] =$$

$$\left[\frac{1}{2}|U_1|\angle\beta_1 \cdot |I_1|\angle-\alpha_1, \frac{1}{2}|U_2|\angle\beta_2 \cdot |I_2|\angle-\alpha_2, \frac{1}{2}|U_3|\angle\beta_3 \cdot |I_3|\angle-\alpha_3, \ldots, \frac{1}{2}|U_N|\angle\beta_N \cdot |I_N|\angle-\alpha_N\right] =$$

$$\left[\frac{1}{2}|U_1|\cdot|I_1|\angle\varphi_1, \frac{1}{2}|U_2|\cdot|I_2|\angle\varphi_2, \frac{1}{2}|U_3|\cdot$$

-continued $$|I_3|\angle\varphi_3, \ldots, \frac{1}{2}|U_N|\cdot|I_N|\angle\varphi_N\right] =$$

$$[P_1 + jQ_1, P_2 + jQ_2, P_3 + jQ_3, \ldots, P_N + jQ_N]$$

The active power $P_1$ is obtained as the real part of $S_1$, in accordance with:

$$P_1 = Re\{S_1\} = Re\{P_1+jQ_1\} \quad [7]$$

The vectors U, I and S contain the frequency spectrum from the angular frequency $f=0$ Hz to $f=f_s$ Hz. There is often a desire to weight the information and/or zero certain frequencies. A simple and effective way of doing this is to introduce the weighting vector W, in accordance with:

$$W=[w_1,w_2,w_3,\ldots,w_N] \quad [8]$$

The weighing factor W contains elements, $w_k$, that contain constants that are multiplied, element by element, by U, I and S. If the voltage vector U is to be zeroed for frequencies above half the sampling frequency, the following operation is carried out (the point notation in [9] relates to multiplication element by element):

$$U_{mod} = U \cdot W \quad [9]$$

where $$w_k = \begin{cases} 1 \text{ for } 1 \leq k \leq \frac{N}{2} \\ 0 \text{ for } \frac{N}{2} < k \leq N \end{cases}$$

$U_{mod}$ is the modified voltage vector containing the frequency spectrum up to half the sampling frequency. Above this, the elements of the voltage vector are zero.

The weighting vector's elements, $w_k$, can be selected so that the required result is obtained. For example, a filter characteristic can be achieved by selecting suitable values of the elements $w_k$. In addition, different weighting vectors can be introduced for U, I and S with the aim of achieving the required result.

The flicker power, $\Pi$, is obtained by summation of the powers, $P_k$, which contribute to the flicker phenomenon. This is to say:

$$\Pi = \sum_{k=1}^{N} Re\left\{\frac{1}{2}W_k \cdot U_k \cdot I_k^*\right\} \quad [10]$$

Figure 4:
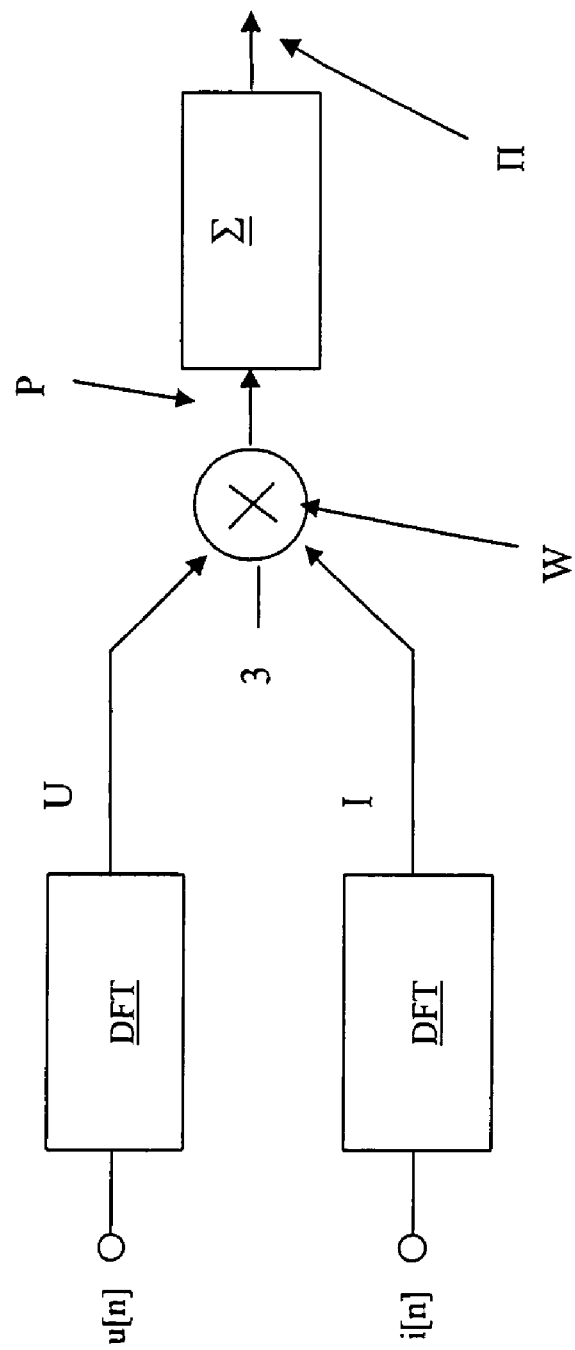
FIG. 4 shows a signal flow chart for a measurement method according to an embodiment of the invention.

FIG. 4 shows a signal flow chart for a measurement method according to an embodiment of the invention for a first measurement method. The calculation of the flicker power $\Pi$ is carried out by frequency analysing the wave form of the voltage and current.

The input signals for the signal flow chart in FIG. 4 consist of the two input signal vectors, u[n] and i[n], which contain the sampled wave forms for voltage and current. The distance in time between two indices (n and n+1) in the input signal vectors corresponds to $1/f_s$, where $f_s$ relates to the sampling frequency.

By utilizing the previously described theory for the signal flow chart that is described in FIG. 4, the flicker power can be calculated. FIG. 4 shows two blocks designated DFT that refer to a transformation of the current signal and voltage signal, i(n) and u(n) respectively, by a so-called Discrete Fourier Transform. The signal that comes out from the DFT for the voltage signal u(n) is designated U and comprises the components $U_k \angle \beta_k$ which relate to a number of values for different angles $\beta_k$, where the index k indicates which point is referred to in the DFT. The signal that comes out from the DFT for the current signal i(n) is designated I and comprises the components $I_k \angle \phi_k$ which relate to a number of values for different angles $\phi_k$, where the index k indicates which point is referred to in the DFT. FIG. 4 shows a multiplier 3 in which the vectors U, I and W are multiplied. The output signal from the multiplier is designated P and relates to a power vector comprising components partial powers $P_k$ that describe the active power in accordance with [7] as the real part of the complex power S in accordance with [6] and [7].

$$P_k = Re\{0.5 \cdot w_k \cdot |U_k| \angle \beta_k \cdot |I_k| \angle -\phi_k\} \quad [10a]$$

FIG. 4 shows, in addition, a summation point Σ that indicates the creation of the flicker power Π by summation of the active powers $P_k$ in accordance with [10a], where:

$$\Pi = \sum_{k=1}^{N} Re\{0.5 \cdot w_k \cdot |U_k| \angle \beta_k \cdot |I_k| \angle -\varphi_k\} \quad [10b]$$

The frequency spectrums of the wave forms u[n] and i[n] are calculated by an N-point DFT analysis. Thereafter, the flicker power Π is calculated by utilizing [10]. The content of the weighting vector W is decisive for the final result. Elements in W are to be selected so that the power in the carrier wave is zeroed and so that only the tones that originate from flicker are included. This can be carried out in three ways. The information is used from either 1) the upper side-band, 2) the lower side-band or 3) there is a summation per frequency of the information in both side-bands, and the power is thereafter calculated by utilizing [10].

In order to exemplify how the calculations are carried out, we assume that the carrier wave signal is found in element M of the vectors U and I. We also assume that the low-frequency flicker tones in the vectors U and I are found in the elements k with the index:

$$M-i \leq k < M \text{ and } M < k \leq M+i$$

The number of flicker tones is given by the constant i. If the choice is made to utilize the information in the lower side-band for the calculation of the flicker power, the elements $w_k$ in the weighting vector W are selected, in accordance with $$w_k = \begin{cases} 0 \text{ for } 1 \leq k < M-i \\ 2 \text{ for } M-i \leq k < M \\ 0 \text{ for } M \leq k \leq N \end{cases}$$

The flicker power is thereafter created by utilizing the formula [10].

If the choice is made to utilize the information in the upper side-band for the calculation of the flicker power, the elements $w_k$ in the weighting vector W are to be selected, in accordance with $$w_k = \begin{cases} 0 \text{ for } 1 \leq k \leq M \\ 2 \text{ for } M < k \leq M+i \\ 0 \text{ for } M+i < k \leq N \end{cases}$$

The flicker power is thereafter created by utilizing the formula [10].

If the choice is made to utilize the information in both side-bands for the calculation of the flicker power, the elements $w_k$ in the weighting vector W are selected, in accordance with $$w_k = \begin{cases} 0 \text{ for } 1 \leq k < M-i \\ 1 \text{ for } M-i \leq k < M \text{ and } M < k \leq M+i \\ 0 \text{ for } k = M \end{cases}$$

The flicker power Π is thereafter created by the formula $$\Pi = \sum_{k=0}^{i-1} Re\left\{\frac{1}{2} w_k \cdot (U_{(M-i+k)} + U_{(M+i-k)}) \cdot (I_{(M-i+k)} + I_{(M+i-k)})^*\right\} \quad [10c]$$

Figure 5:
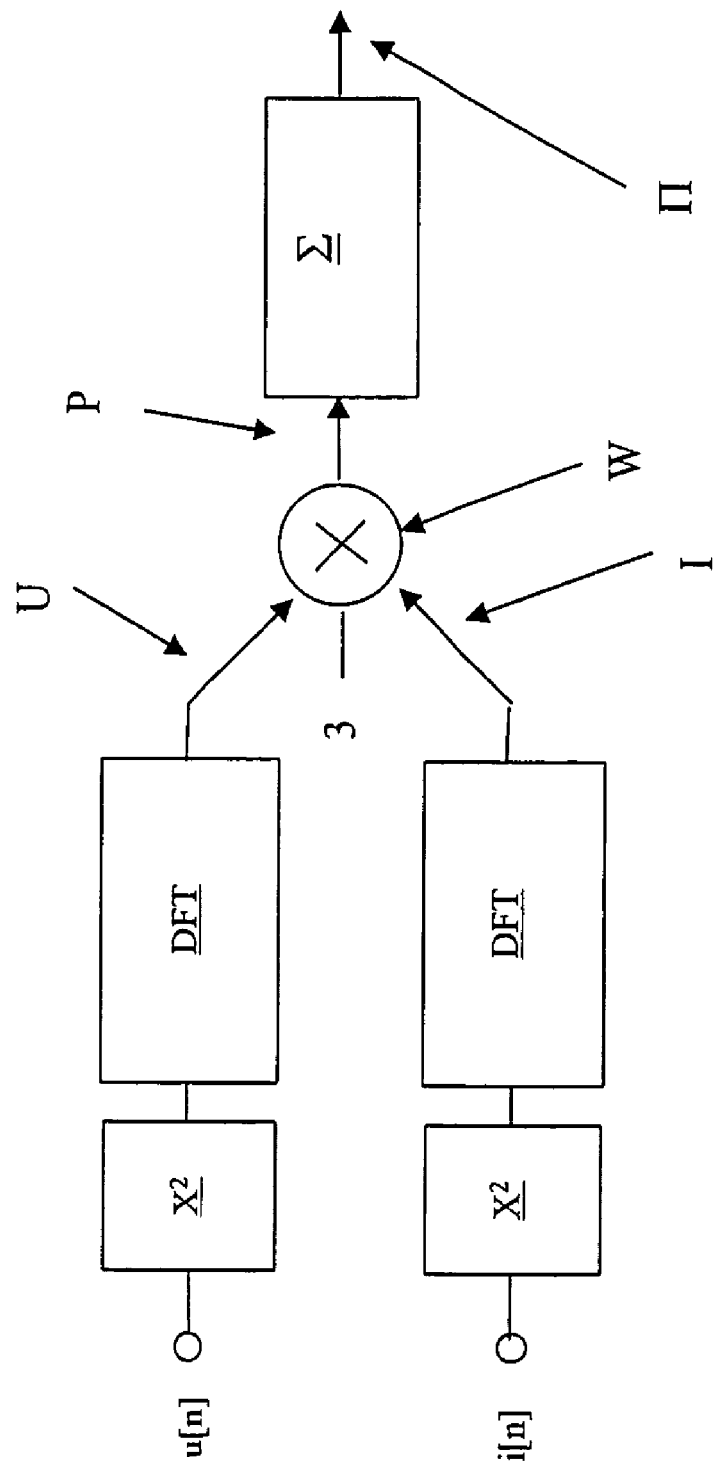
FIG. 5 shows a signal flow chart for a measurement method according to a second embodiment of the invention.

FIG. 5 shows a signal flow chart for a second measurement method according to another embodiment of the invention, where the calculation of the flicker power is carried out by square demodulation of voltage and current, after which a DFT analysis of the low-frequency signals is carried out.

The method is reminiscent of the first measurement method described in association with FIG. 4, with the difference that, before the frequency spectrum is calculated, the signals are square demodulated, which is designated $X^2$ in FIG. 5. By this means, the low-frequency signals are separated from the carrier wave, in accordance with the expression below:

$$u^2(t) = \left(U_c + \sum_{k=1}^{N} U_{mk} \cos(\omega_k t + \beta_k)\right)^2 \cos^2(\omega_c t + \beta_c) = \quad [11]$$

$$\left(U_c^2 + 2 \cdot U_c \cdot \sum_{k=1}^{N} U_{mk} \cos(\omega_k t + \beta_k) + \left(\sum_{k=1}^{N} U_{mk} \cos(\omega_k t + \beta_k)\right)^2\right) \cdot$$

$$\frac{1}{2}(1 + \cos(2\omega_c t + 2\beta_c)) =$$

$$\left\{\frac{U_c^2}{2} + \frac{1}{2} \cdot 2 \cdot U_c \cdot \sum_{k=1}^{N} U_{mk} \cos(\omega_k t + \beta_k) + \frac{1}{2} \cdot \left(\sum_{k=1}^{N} U_{mk} \cos(\omega_k t + \beta_k)\right)^2\right\} + \left\{\frac{U_c^2}{2} + \frac{1}{2} \cdot 2 \cdot U_c \cdot \sum_{k=1}^{N} U_{mk} \cos(\omega_k t + \beta_k) + \frac{1}{2} \cdot \left(\sum_{k=1}^{N} U_{mk} \cos(\omega_k t + \beta_k)\right)^2\right\} \cdot \frac{1}{2} \cos(2\omega_c t + 2\beta_c)$$

Square demodulation means that two signal packages are created, separated in frequency. One signal package consists of a direct component, the modulating frequencies and the modulating signals squared. The latter is an unwanted combination product. The second signal package contains the same terms but centred in frequency around double the carrier wave frequency. For calculation of the flicker power, only the terms are included that are marked by double underlining in [11]. One term contains the low-frequency flicker tones multiplied by the carrier wave amplitude and the other term is the modulated signal squared. In terms of size, the first term is much larger than the second, which means that the squared term affects the result very little. Corresponding expressions are obtained when squaring the current signal i(t).

The input signals for the signal flow chart in FIG. 5 consist of the two input signal vectors, u[n] and i[n], which contain the sampled wave forms for voltage and current. The distance in time between two indices (n and n+1) in the input signal vectors corresponds to $1/f_s$. In $X^2$ each element in the input signal vectors is squared and constitutes input data for the N-point Discrete Fourier Transform, DFT. The output signal from the respective DFT is complex-value vectors U and I containing frequency spectrums for u[n] and i[n] (both amplitude information and phase information) with a frequency resolution of $\Delta f = f_s/N$. The content in U and I is expressed by:

$$U = [U_1, U_2, U_3, \ldots U_N] = [|U_1|\angle\beta_1, |U_2|\angle\beta_2, |U_3|\angle\beta_3, \ldots, |U_N|\angle\beta_N]$$

$$I = [I_1, I_2, I_3, \ldots, I_N] = [|I_1|\angle\alpha_1, |I_2|\angle\alpha_2, |I_3|\angle\alpha_3, \ldots, |I_N|\angle\alpha_N]$$

The complex power, S, is calculated by:

$$S = \frac{1}{2} w1_k \cdot U \cdot w2_k \cdot I^* \qquad [12]$$

The sought flicker power Π is then obtained by the formula $$\Pi = \sum_{k=1}^{i} \text{Re}\left\{\frac{1}{2} w1_k \cdot U_k \cdot w2_k \cdot I_k^*\right\} \qquad [13]$$

The elements $w1_k$ and $w2_k$ zero the frequency components that do not cause flicker and weight the correct amplitudes of the frequency components $U_k$ and $I_k$, in accordance with $$w1_k = \begin{cases} \frac{1}{U_c} & \text{for } 1 \le k \le i \\ 0 & \text{for } k > i \end{cases} \qquad [14]$$

$$w2_k = \begin{cases} \frac{1}{I_c} & \text{for } 1 \le k \le i \\ 0 & \text{for } k > i \end{cases} \qquad [15]$$

In [13], [14] and [15], it is assumed that flicker tones are found in a frequency band up to and including tone i ($0 < f_{flicker} \le i$). The correct value for the weighting factors can be identified by studying [11]. The method is not limited to the weighting factors that are given above, other constants in the weighting vector being able to be used to obtain the required filter effect.

Figure 6:
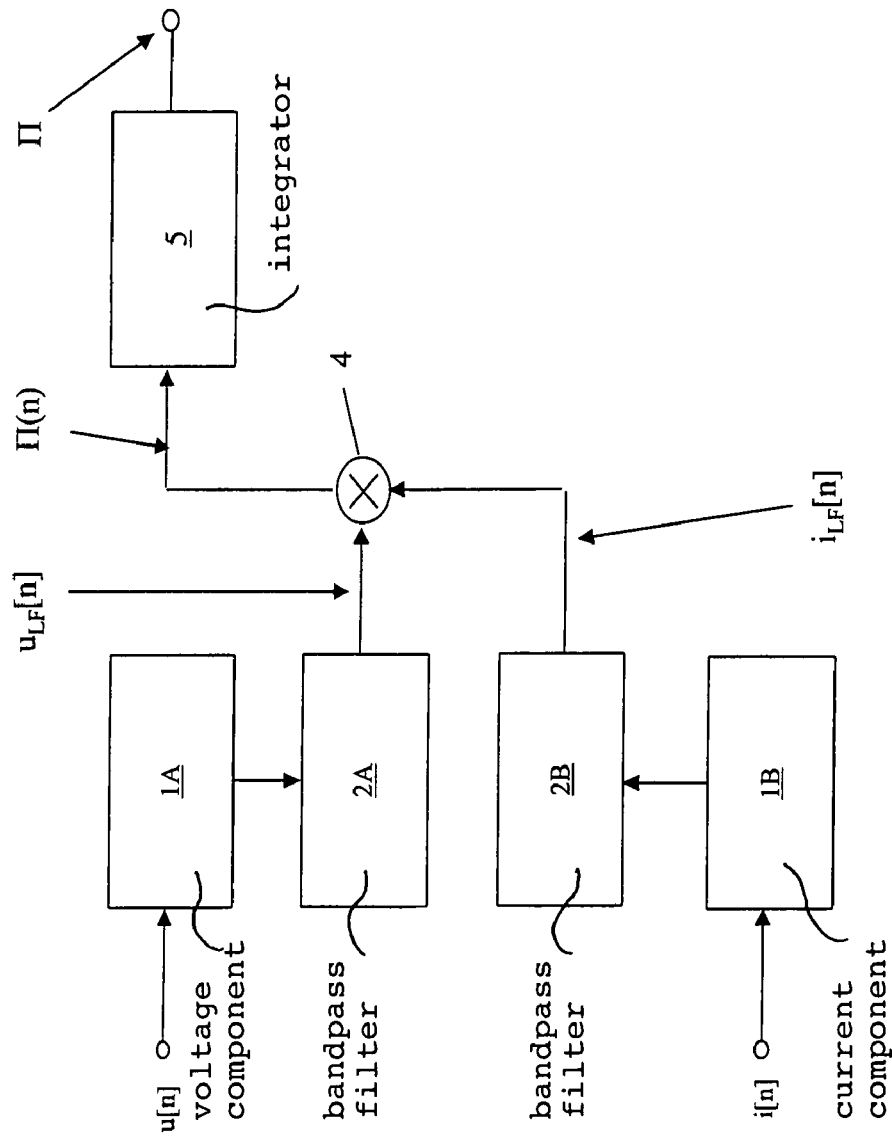
FIG. 6 shows a signal flow chart for a measurement method according to yet another embodiment of the invention.

FIG. 6 shows a signal flow chart according to yet another embodiment of the invention for a third measurement method, where the flicker power is calculated by square demodulation of voltage u(n) and current i(n) where the low-frequency tones are filtered by the use of bandpass filters 2A and 2B respectively.

Instead of using DFT analysis and weighting vectors as described in the two previous embodiments described in association with FIGS. 4 and 5, in this measurement method bandpass filters 2A, 2B are used for filtering the low-frequency flicker tones.

The input signal vectors u[n] and i[n] contain the sampled wave forms for voltage and current. In the components 1A and 1B, the carrier wave (signal from the network frequency) and the low-frequency flicker tones are separated, similarly to the measurement method described in association with FIG. 5, by each sample being squared. Only the low-frequency flicker tones are allowed to pass through the bandpass filters 2A and 2B. As input signals to the multiplier 4, there are thus only the low-frequency flicker tones in voltage $U_{LF}[N]$ and current $i_{LF}[n]$. The output signal from the multiplier 4 is the instantaneous flicker power $\Pi[n] = u_{LF}[n] \times i_{LF}[n]$. The flicker power Π is obtained by the integrator 5 creating an average value for the instantaneous power Π(n). This can be carried out with a digital filter in the form of, for example, a low-pass filter.

The bandpass filters 2A and 2B are dimensioned to obtain a lower limit frequency of 0.1 Hz and an upper limit frequency of 25 Hz. Alternatively, the bandpass filters can be used that are defined in the standard IEC 61000-4-15 that describes a flicker algorithm.

The transmission function for the filter in the IEC standard is expressed as $$H(s) = \frac{k\omega_1 s}{s^2 + 2\lambda s + \omega^2} \cdot \frac{1 + s/\omega_2}{(s + 1/\omega_3)(s + 1/\omega_4)} \qquad [16]$$

The coefficients in [16] are to have values in accordance with the following table.

TABLE 1

| | |
|---|---|
| k = 1.74802 | λ = 2π · 4.05981 |
| $\omega_1$ = 2π · 9.15494 | $\omega_3$ = 2π · 1.22535 |
| $\omega_2$ = 2π · 2.27979 | $\omega_4$ = 2π · 21.9 |

Figure 7:
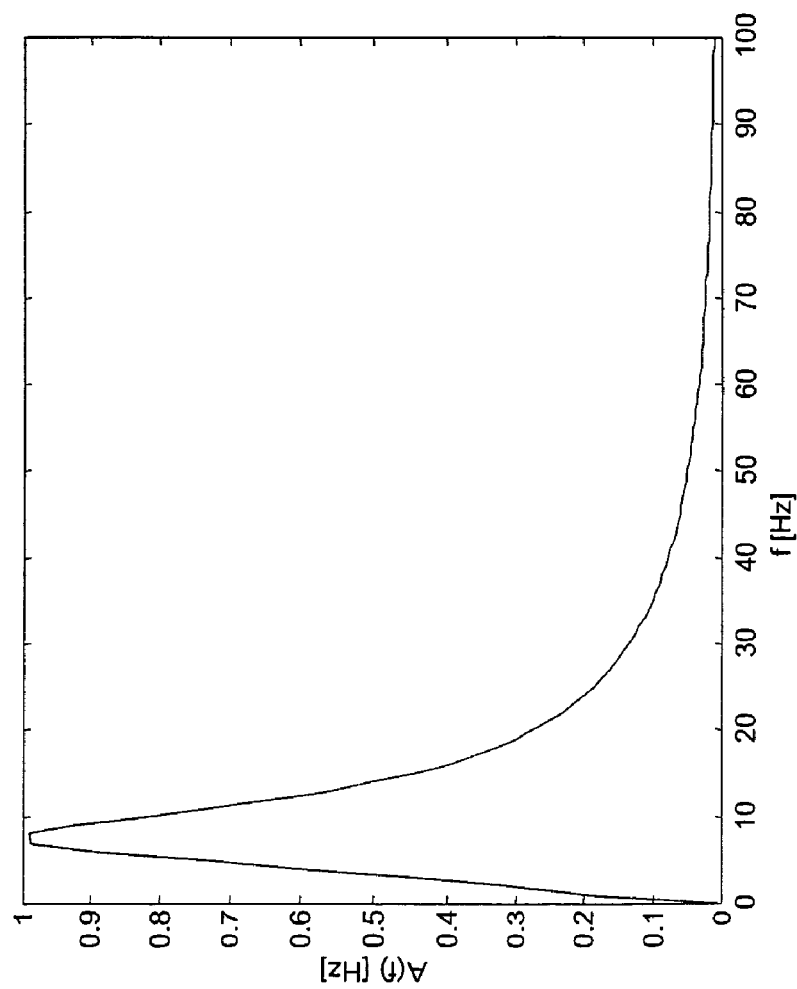
FIG. 7 shows an amplitude characteristic for a bandpass filter that is used in the embodiment described in association with FIG. 6.

FIG. 7 shows the amplitude characteristic for the bandpass filter with transmission function in accordance with [16] and coefficients in accordance with Table 1.

It is also possible to select bandpass filters with a different characteristic to that described in [16]. For example, an Mth order Butterworth or Chebishev filter can be selected.

Figure 8:
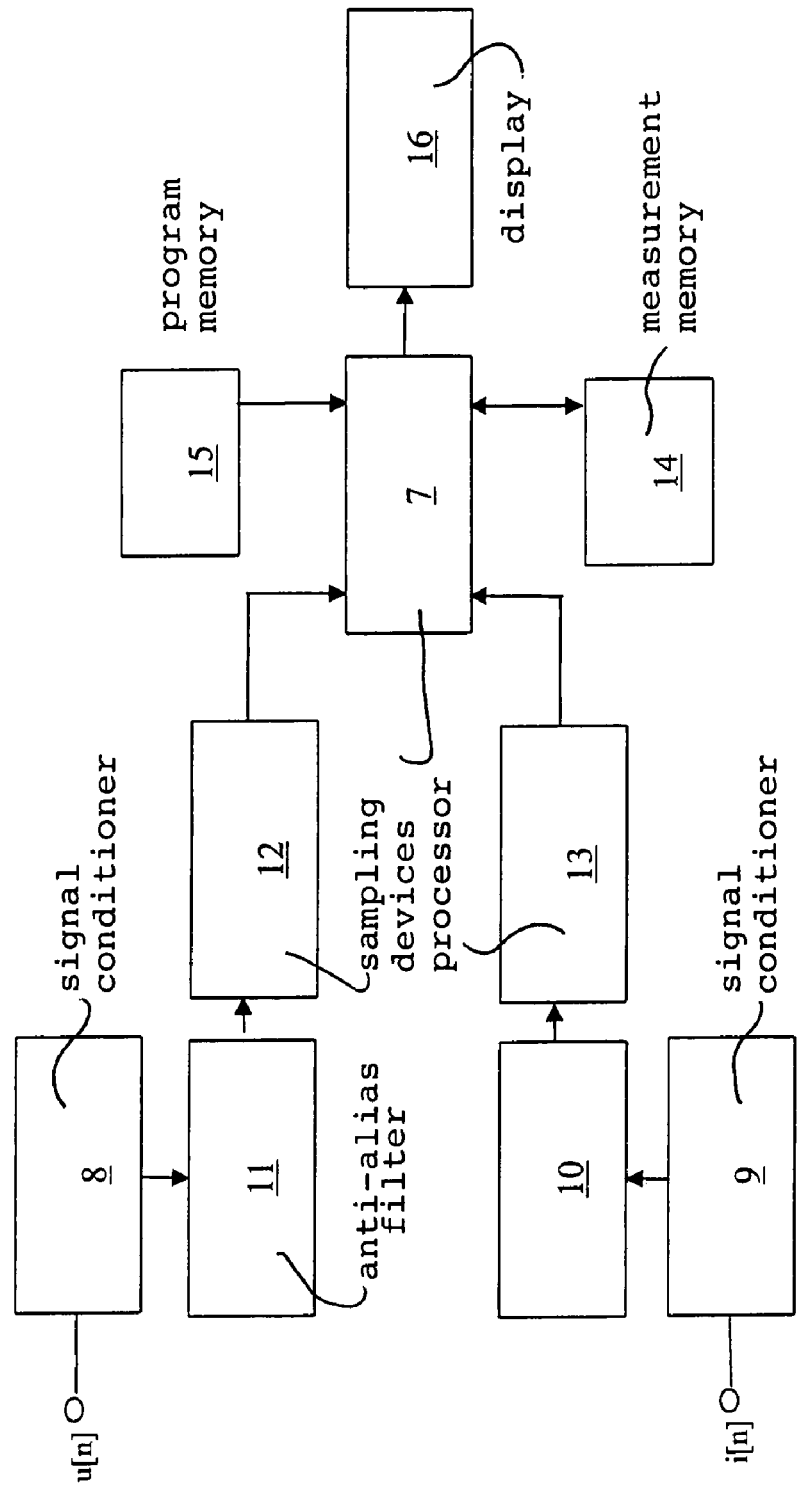
FIG. 8 shows an outline block diagram of an arrangement that can be used for the methods described in the different embodiments.

FIG. 8 shows a block diagram of the hardware for the instrument. The instrument is constructed around a signal processor 7 which administers the measurement information and carries out necessary calculations according to the measurement methods that are described in the FIGS. 4-6 and 9. The signal processor 7 also controls the sampling process for the conversion of analogue signals to digital signals (the A/D conversion). The recorded signals; that is, the wave form of current and voltage, are obtained either from current transformers and voltage transformers in the network or from measurement sensors that are to be found in the instrument. The signal processor can be a computer or a logic circuit, or some other suitable device for controlling devices and for signal processing of signals.

FIG. 8 shows a signal-conditioning device 8 for the recorded voltage signal. The measured voltage is signal-matched by a resistive voltage division, whereby the correct input signal level is obtained for the following step which is an anti-alias filter 10.

FIG. 8 also shows a signal-conditioning device 9 for the recorded current signal. The signal level for the current channel is matched to the instrument, either via a low-ohm shunt, with the voltage drop across the shunt being amplified and becoming the input signal level for the following step which is an anti-alias filter 11, or alternatively, the current signals can be obtained from current tongs connected to the instrument.

The task of the anti-alias filters 10, 11 is to prevent weighting distortion which arises if the recorded signal has a frequency content that exceeds half the sampling frequency (see theory for the sampling theorem). The anti-alias filters can be implemented in the form of an analogue Sallen-Key low-pass filter according to FIG. 7 and have a limit frequency corresponding to half the sampling frequency.

The level-matched and filtered signals are sampled in sampling devices 12, 13 with a sampling frequency, for example 6400 Hz. The digital raw data in the form of sampled amplitude values is saved in a measurement memory 14 and later constitutes the input data for the measurement methods described above.

Software that controls the signal processor 7 is found in a program memory 15. The finished result, that is the flicker power with sign value and internal impedance, can be shown both numerically and graphically in a display device 16. The display device can be any known device for numerical and graphical display, for example a VDU.

Figure 9:
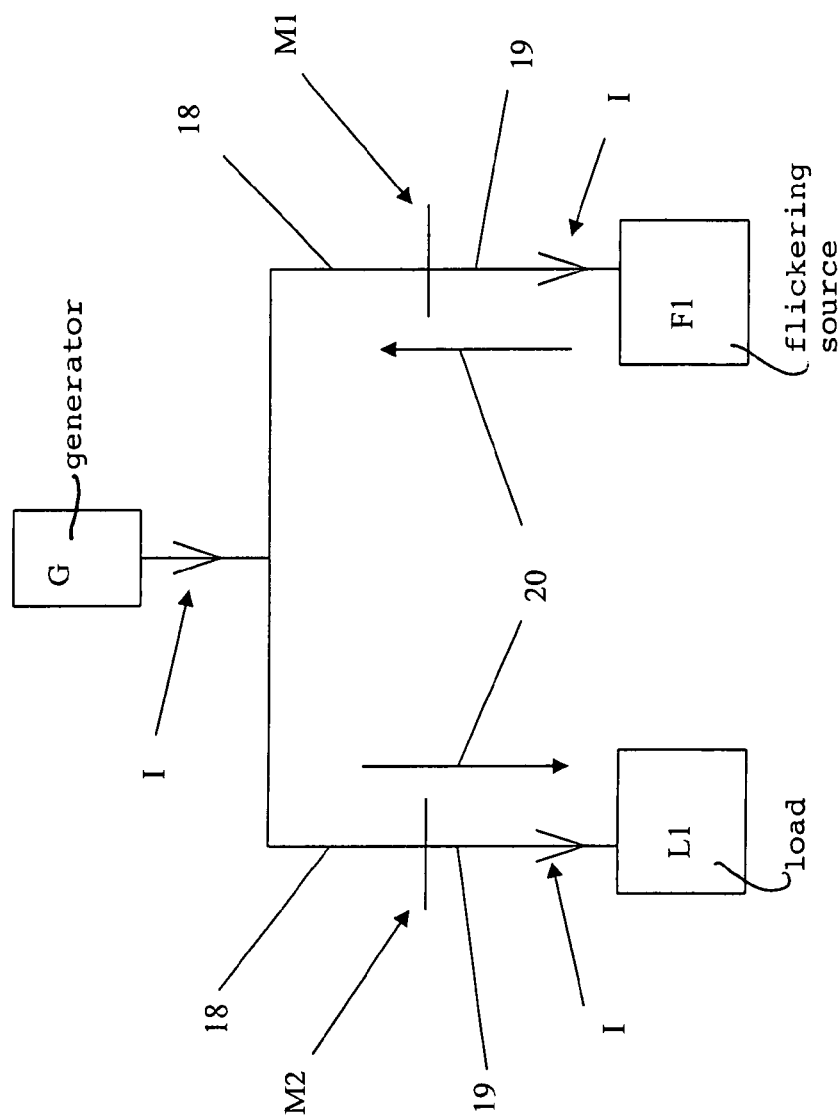
FIG. 9 shows schematically a network comprising a flickering source F1, a load L1, a generator G for generating an alternating voltage.

FIG. 9 shows schematically a network comprising a flickering source F1, a load L1, a generator G for generating an alternating voltage. In FIG. 9, the current direction for the current I is shown by an arrow in the connecting lines. The current goes from the generator G to the flickering source F1 and the load L1. FIG. 9 also shows a first measurement point M1. In association with M1, there is marked a point above 18 the measurement point M1 and a point below 19 the measurement point M1. FIG. 9 also shows a second measurement point M2. In association with M2 there is marked a point above 18 the measurement point M2 and a point below 19 the measurement point M2. The flickering source F1 emits into the network a low-frequency amplitude variation that propagates in the direction shown by a solid-line arrow 20 in FIG. 9.

In the method according to the invention described above, the flicker power Π indicates in which direction the flickering source is located in relation to a measurement point. According to an embodiment of the invention, the sign value of the flicker power is negative when the flickering source is located below 19 the measurement point and positive when the flickering source is located above 18 the measurement point.

At the first measurement point M1, a negative sign is thus obtained for the flicker power Π, as the flickering source F1 is located below 19 the first measurement point. This is because the low-frequency variations in current and voltage are in antiphase at the first measurement point M1.

At the second measurement point M2, on the other hand, a positive sign is obtained for the flicker power Π, as the flickering source F1 is located above 18 the second measurement point M2. This is because the low-frequency variations in current and voltage are in phase at the second measurement point M2.

FIG. 10 shows schematically a diagram of the flicker power Π for a number of sampling points n during a certain period of time when recordings were made of the modulated current signals and voltage signals i(n), u(n).

FIG. 10 shows a first curve K1 on the negative lower part of the diagram. The diagram also shows a second curve K2 on the upper part of the diagram. The first curve K1 corresponds to a power signal which, after the creation of the average value, gives rise to a flicker power Π with a negative value and thus corresponds to the flicker power Π that was obtained at the first measurement point M1 in FIG. 9. The second curve K2 corresponds to a power signal which, after the creation of the average value, gives rise to a flicker power Π with a positive value and thus corresponds to the flicker power Π which was obtained at the second measurement point M2 in FIG. 9.

FIG. 10 also shows that K1 inverted about the sampling axis n corresponds to K2. This has been demonstrated in experiments and the explanation is that the flicker power Π changes sign when the propagation of the low-frequency flicker is changed from going against the power direction of the basic tone to going with the power direction of the basic tone, or vice versa. It is thus necessary to know in which direction the generator and load respectively are to be found in relation to the measurement point in order for it to be possible to interpret the sign value in the correct way. The part of the diagram that shows the period between zero and where K1 and K2 respectively start, shows a period of time when the flickering source F1 is not connected in.

The invention claimed is:

1. A method for determining the direction of a flickering source in relation to a measurement point in an electrical network, the method comprising the steps of:

with a recorder apparatus, recording, at a measuring point, an amplitude-modulated current signal (i(n)), the recorded current signal comprising: i) signals that originate from the network frequency ($f_c$) and ii) low-frequency current amplitude variations in the current signal (i(n));

with another recorder apparatus, recording, at a measuring point, an amplitude-modulated voltage signal (u(n)), the recorded voltage signal comprising: i) signals that originate from the network frequency ($f_c$) and ii) low-frequency voltage amplitude variations in the voltage signal (u(n));

with a signal processor apparatus, demodulating the recorded current signal (i(n)) and extracting, from the demodulated current signal, only the low-frequency current amplitude variations, the extracted low-frequency current amplitude variations representing a flicker component for the current signal (i(n));

with another signal processor apparatus, demodulating the recorded voltage signal (u(n)) and extracting, from the demodulated voltage signal, only the low-frequency voltage amplitude variations, the extracted low-frequency voltage amplitude variations representing a flicker component for the voltage signal (u(n));

with a multiplier apparatus, creating a product by multiplication of the flicker component for the current signal and the flicker component for the voltage signal;

with a processor apparatus, creating one of i) an average value of the instantaneous power signal (Π(n)) and ii) a summation of the partial powers Pk, wherein a flicker power (Π) is obtained with a sign value that indicates the direction the flickering source is located in relation to the measurement point; and displaying an indication of the direction that the flickering source is located in relation to the measurement point, wherein, said step of demodulating the recorded current signal comprises the steps:

creating a first demodulated signal by demodulating the recorded current signal (i(n)); and filtering, by one of i) a band pass filter and ii) a multiplication of weight distribution factors, the first demodulated signal to eliminate the signals that originate from the network frequency ($f_c$) in the first demodulated signal so that only the low-frequency current amplitude variations remain, the remaining low-frequency current amplitude variations representing the flicker component for current, and said step of demodulating the recorded voltage signal (u(n)) comprises the steps:

creating a second demodulated signal by demodulation of the recorded voltage signal; and filtering, by one of i) a band pass filter and ii) a multiplication of weight distribution factors, the second demodulated signal to eliminate the signals that originate from the network frequency in the second demodulated signal so that only the low-frequency voltage amplitude variations remain, the remaining low-frequency voltage amplitude variations representing the flicker component for voltage.

2. The method of claim 1, wherein the sign value of the flicker power is negative when the flickering source is located below (19) the measurement point (17) and the sign value is positive when the flickering source is located above (18) the measurement point (17).

3. The method of claim 1, comprising the further steps of:

filtering the signals that originate from the network frequency ($f_c$) in the first demodulated signal so that only the low-frequency current amplitude variations relating to the flicker component for current remain;

filtering the signals that originate from the network frequency in the second demodulated signal so that the low-frequency voltage amplitude variations relating to the flicker component for voltage remain;

creating an instantaneous power signal ($\Pi(n)$) by forming a product by multiplication of the flicker signal ($I_{LF(n)}$) for current and the flicker signal ($U_{LF(n)}$) for voltage; and processing the product to create the average value of the instantaneous power signal ($\Pi(n)$) whereby the flicker power ($\Pi$) is created with the sign value.

4. The method of claim 3, wherein, creating the first demodulated signal by square demodulation of the current signal; and creating the second demodulated signal by square demodulation of the voltage signal.

5. The method of claim 3, wherein, the filtering of the first demodulated signal is carried out with a bandpass filter with a lower limit of 0.1 Hz and an upper limit of 35 Hz.

6. The method of claim 3, wherein, the filtering of the first demodulated signal is carried out with a bandpass filter with a lower limit of 0.1 Hz and an upper limit of 25 Hz.

7. The method of claim 1, wherein, creating the first demodulated signal is by square demodulation of the current signal; and creating the second demodulated signal is by square demodulation of the voltage signal.

8. The method of claim 1, wherein, the filtering of the first demodulated signal is carried out with a bandpass filter with a lower limit of 0.1 Hz and an upper limit of 35 Hz.

9. The method of claim 8, wherein the flicker power ($\Pi$) is created by the following step:

summing the partial powers ($P_k$) by the formula:

$$\Pi = \sum_{k=1}^{N} \mathrm{Re}\left\{\frac{1}{2} W_k \cdot U_k \cdot I_k^*\right\}.$$

10. The method of claim 8, wherein the flicker power ($\Pi$) is created by the following steps:

square-demodulation ($x^2$) of the voltage signal (u(n));

square-demodulation ($x^2$) of the current signal (i(n));

calculating the frequency spectrum of the square-demodulated voltage signal by an N-point DFT analysis (Discrete Fourier Transform) to determine the voltage vector (U);

calculating the frequency spectrum of the square-demodulated current signal by an N-point DFT analysis (Discrete Fourier Transform) to determine the current vector (I); and creating the flicker power ($\Pi$) by summation of the partial powers ($P_k$) contributing to the flicker by the formula:

$$\Pi = \sum_{k=1}^{N} \mathrm{Re}\left\{\frac{1}{2} w1_k \cdot U_k \cdot w2_k \cdot I_k^*\right\}$$

where the elements $w1_k$ and $w2_k$ eliminate the power component originating from the network frequency and weight the correct amplitudes of the frequency components $U_k$ and $I_k$, in accordance with:

$$w1_k = \begin{cases} \dfrac{1}{U_c} & \text{for } 1 \leq k \leq i \\ 0 & \text{for } k > i \end{cases}$$

$$w2_k = \begin{cases} \dfrac{1}{I_c} & \text{for } 1 \leq k \leq i \\ 0 & \text{for } k > i \end{cases}$$

where the low-frequency flickers are to be found in a frequency band up to and including tone i ($0 < f_{flicker} \leq i$).

11. The method of claim 1, wherein, the filtering of the first demodulated signal is carried out with a bandpass filter with a lower limit of 0.1 Hz and an upper limit of 25 Hz.

12. A method of diagnosing at a measurement point in an electrical network, the method comprising the steps of:

with a recorder apparatus, recording an amplitude-modulated current signal (i(n)) comprising signals that originate from the network frequency ($f_c$) and low-frequency current amplitude variations in the current signal (i(n));

with another recorder apparatus, recording an amplitude-modulated voltage signal (u(n)) comprising signals that originate from the network frequency ($f_c$) and low-frequency voltage amplitude variations in the voltage signal (u(n));

with a signal processor apparatus, analyzing the frequency of the voltage signal (u(n)) by an N-point DFT analysis (Discrete Fourier Transform), to determine a voltage vector (U) containing the frequency spectrum for the voltage signal (u(n)) in the form of N complex voltages, each of the N complex voltages corresponding to a different frequency;

with another signal processor apparatus, analyzing the frequency of the current signal (i(n)) by an N-point DFT analysis (Discrete Fourier Transform), to determine a current vector (I) containing the frequency spectrum for the current signal (i(n)) in the form of N complex currents, each of the N complex currents corresponding to a different frequency;

with a multiplier apparatus, creating a power vector (P) by multiplying, for each frequency, a corresponding one of the N complex voltages of the voltage vector (U) with a corresponding one of the N complex currents of the current vector (I);

with a processor apparatus, eliminating the power component originating from the network frequency from the power vector (P) by multiplying the power vector (P) by a weighting vector (W) so that the power vector (P), after the multiplication, comprises partial powers ($P_k$) concerning power components from the flickering source;

with the processor apparatus, creating a flicker power (Π) with a sign value by summation of the partial powers ($P_k$);

with the processor apparatus, analyzing the sign value to determine the direction, from the measurement point, that the flickering source is to be found; and displaying an indication of the direction that the flickering source is located in relation to the measurement point.

13. An arrangement for deciding the direction to a flickering source in relation to a measurement point in an electricity network, the arrangement comprising:

a first recorder for recording an amplitude-modulated current signal (i(n)) comprising signals that originate from the network frequency ($f_c$) and low-frequency current amplitude variations in the current signal (i(n));

a second recorder for recording an amplitude-modulated voltage signal (u(n)) comprising signals that originate from the network frequency ($f_c$) and low-frequency voltage amplitude variations in the voltage signal (u(n));

a first signal processor for demodulating the current signal (i(n)) and extracting, from the demodulated current signal, only the low-frequency current amplitude variations that represent a flicker component for the current signal (i(n));

a second signal processor for demodulating the voltage signal (u(n)) and extracting, from the demodulated voltage signal, only the low-frequency voltage amplitude variations that represent a flicker component for the voltage signal (u(n));

a multiplier for creating a product by multiplication of the flicker component for current and the flicker component for voltage;

a processor for processing the product to create one of i) an average value of the instantaneous power signal (Π(n)) and ii) a summation of the partial powers Pk, wherein a flicker power (Π) is obtained with a sign value that indicates the direction the flickering source is located in relation to the measurement point; and a display for displaying an indication of the direction that the flickering source is located in relation to the measurement point, wherein, the first signal processor for the current signal (i(n)) comprises:

a first part for creating a first demodulated signal by means of demodulation of the current signal (i(n)), and a second part for filtering to remove the signals that originate from the network frequency ($f_c$) in the first demodulated signal so that only the low-frequency current amplitude variations that represent the flicker component for current remain;

the second signal processor for the voltage signal (u(n)), comprises:

a first part for creating a second demodulated signal by means of demodulation of the voltage signal, and a second part for filtering to remove the signals that originate from the network frequency in the second demodulated signal so that only the low-frequency voltage amplitude variations that represent the flicker component for voltage remain.

14. An arrangement for diagnostics at a measurement point in an electrical network, the arrangement comprising:

a first recorder for recording an amplitude-modulated current signal (i(n)) comprising signals that originate from the network frequency ($f_c$) and the low-frequency current amplitude variations in the current signal (i(n));

a second recorder for recording an amplitude-modulated voltage signal (u(n)) comprising signals that originate from the network frequency ($f_c$) and the low-frequency voltage amplitude variations in the voltage signal (u(n));

a first signal processor for frequency analysis of the voltage signal (u(n)) by an N-point DFT analysis (Discrete Fourier Transform), to determine a voltage vector (U) containing the frequency spectrum for the voltage signal (u(n)) in the form of N complex voltages, each of the N complex voltages corresponding to a different frequency;

a second signal processor for frequency analysis of the current signal (i(n)) by an N-point DFT analysis (Discrete Fourier Transform), to determine a current vector (I) containing the frequency spectrum for the current signal (i(n)) in the form of N complex currents, each of the N complex currents corresponding to a different frequency;

a multiplier for the creation of a power vector (P) by the multiplication, at each frequency, of a corresponding one of the N complex voltages of the voltage vector (U) with a corresponding one of the N complex currents of the current vector (I);

a first processor for the multiplication of the power vector (P) by a weighting vector (W) to eliminate the power component originating from the network frequency so that the power vector (P), after the multiplication, comprises partial powers ($P_k$) concerning power components from the flickering source;

a second processor for the creation of a flicker power (Π) with a sign value, by summation of the partial powers ($P_k$);

an analyzer for analysis of the sign value for indicating the direction, from the measurement point, that the flickering source is to be found; and a display for displaying an indication of that direction that the flickering source is located in relation to the measurement point, wherein, the first signal processor is configured to execute the steps of:

creating a first demodulated signal by demodulation of the current signal (i(n)), and filtering to eliminate the signals that originate from the network frequency ($f_c$) in the first demodulated signal so that only the low-frequency current amplitude variations representing the flicker component for current remain, the second signal processor is configured to execute the steps of:

creating a second demodulated signal by demodulation of the voltage signal;

filtering to eliminate the signals that originate from the network frequency in the second demodulated signal so that only the low-frequency voltage amplitude variations that represent the flicker component for voltage remain.

15. A method for determining the direction of a flickering source in relation to a measurement point in an electrical network, the method comprising the steps:

with a recorder apparatus, recording, at a measuring point, an amplitude-modulated current signal (i(n)) comprising signals that originate from the network frequency ($f_c$) and low-frequency current amplitude variations in the current signal (i(n));

with another recorder apparatus, recording, at a measuring point, an amplitude-modulated voltage signal (u(n)) comprising signals that originate from the network frequency ($f_c$) and low-frequency voltage amplitude variations in the voltage signal (u(n));

with a signal processor apparatus, demodulating the recorded current signal (i(n)) and extracting, from the demodulated current signal, only the low-frequency current amplitude variations, the extracted low-frequency current amplitude variations representing a flicker component for the current signal (i(n));

with another signal processor apparatus, demodulating the recorded voltage signal (u(n)) and extracting, from the demodulated voltage signal, only the low-frequency voltage amplitude variations, the extracted low-frequency voltage amplitude variations representing a flicker component for the voltage signal (u(n));

with a multiplier apparatus, creating a product by multiplication of the flicker component for the current signal and the flicker component for the voltage signal;

with a processor apparatus, creating one of i) an average value of the instantaneous power signal ($\Pi(n)$) and ii) a summation of the partial powers Pk wherein a flicker power ($\Pi$) is obtained with a sign value that indicates the direction the flickering source is located in relation to the measurement point; and displaying an indication of the direction that the flickering source is located in relation to the measurement point, wherein the sign value of the flicker power is negative when the flickering source is located below (19) the measurement point (17) and the sign value is positive when the flickering source is located above (18) the measurement point (17), and wherein, the demodulating of the current signal (i(n)) comprises the steps of:

creating a first demodulated signal by demodulation of the current signal (i(n));

filtering to eliminate the signals that originate from the network frequency ($f_c$) in the first demodulated signal so that only the low-frequency current amplitude variations remain;

the demodulating of the voltage signal (u(n)) comprises the steps of:

creating a second demodulated signal by demodulation of the voltage signal; and filtering to eliminate the signals that originate from the network frequency in the second demodulated signal so that only the low-frequency voltage amplitude variations remain.

\* \* \* \* \*